United States Patent
Huang (10) Patent No.: US 8,421,193 B2
(45) Date of Patent: Apr. 16, 2013

(54) INTEGRATED CIRCUIT DEVICE HAVING THROUGH VIA AND METHOD FOR PREPARING THE SAME

(75) Inventor: Tsai Yu Huang, Zhubei (TW)

(73) Assignee: Nanya Technology Corporation, Kueishan, Tao-Yuan Hsien (TW)

( * ) Notice: Subject to any disclaimer, the term of this patent is extended or adjusted under 35 U.S.C. 154(b) by 197 days.

(21) Appl. No.: 12/949,058

(22) Filed: Nov. 18, 2010

(65) Prior Publication Data

US 2012/0126394 A1 May 24, 2012

(51) Int. Cl.
| | |
|---|---|
| H01L 29/40 | (2006.01) |
| H01L 23/48 | (2006.01) |
| H01L 23/52 | (2006.01) |
| H01L 21/30 | (2006.01) |
| H01L 21/46 | (2006.01) |
| H01L 21/4763 | (2006.01) |
| H01L 21/44 | (2006.01) |

(52) U.S. Cl.
USPC .......... 257/621; 257/774; 257/E23.067; 257/E21.211; 438/455; 438/618; 438/622; 438/637; 438/687

(58) Field of Classification Search .......... None
See application file for complete search history.

(56) References Cited

U.S. PATENT DOCUMENTS

| | | | |
|---|---|---|---|
| 6,908,785 B2 | 6/2005 | Kim | |
| 6,943,067 B2 * | 9/2005 | Greenlaw | 438/152 |
| 7,041,576 B2 * | 5/2006 | Pozder et al. | 438/458 |
| 7,371,662 B2 * | 5/2008 | Chiou | 438/459 |
| 7,453,150 B1 * | 11/2008 | McDonald | 257/774 |
| 7,507,637 B2 * | 3/2009 | Suh et al. | 438/458 |
| 7,683,459 B2 | 3/2010 | Ma et al. | |
| 8,143,712 B2 * | 3/2012 | Chen | 257/686 |
| 2005/0092614 A1 * | 5/2005 | Gallina | 205/157 |
| 2008/0290524 A1 * | 11/2008 | Lanzerotti et al. | 257/770 |
| 2009/0267194 A1 * | 10/2009 | Chen | 257/621 |
| 2009/0283872 A1 | 11/2009 | Lin et al. | |
| 2009/0325343 A1 * | 12/2009 | Lee | 438/107 |
| 2010/0102453 A1 | 4/2010 | Tseng et al. | |
| 2010/0133697 A1 * | 6/2010 | Nilsson | 257/774 |
| 2010/0224876 A1 * | 9/2010 | Zhu | 257/52 |
| 2010/0320575 A9 * | 12/2010 | Chauhan | 257/621 |
| 2012/0061794 A1 * | 3/2012 | Sadaka | 257/503 |

OTHER PUBLICATIONS

Yoichiro Kurita,etc. A 3D Stack Memory Integrated on a Logic Using SMAFTI Technology. 1120 Shimokuzawa, Sagamihara, Kanagawa 229-1198, Japan 2007 Electronic Components and Technology Conference p. 821-829.

* cited by examiner

Primary Examiner — Michael Jung
(74) Attorney, Agent, or Firm — Novak Druce Connolly Bove + Quigg LLP (57) ABSTRACT

An integrated circuit device includes a bottom wafer, at least one stacking wafer positioned on the bottom wafer, and at least one conductive via penetrating through the stacking wafer and into the bottom wafer in a substantially linear manner, wherein the bottom wafer and the stacking wafer are bonded by an intervening adhesive layer, and no bump pad is positioned between the bottom wafer and the stacking wafer. A method for preparing an integrated circuit device includes the steps of forming a bottom wafer, forming at least one stacking wafer, bonding the at least one stacking wafer to the bottom wafer by an intervening adhesive layer, and forming at least one conductive via penetrating through the stacking wafer and into the bottom wafer in a substantially linear manner, wherein no bump pad is positioned between the bottom wafer and the stacking wafer.

18 Claims, 8 Drawing Sheets

FIG. 12

INTEGRATED CIRCUIT DEVICE HAVING THROUGH VIA AND METHOD FOR PREPARING THE SAME

BACKGROUND OF THE INVENTION

The present invention relates to an integrated circuit device having stacking wafers with through silicon vias and a method for preparing the same. More particularly, the present invention relates to an integrated circuit device and method for preparing the same by bonding wafers before the formation of the through silicon via.

Packaging technology for integrated circuit structures has been continuously developed to meet the demand for miniaturization and mounting reliability. Recently, as the miniaturization and high functionality of electric and electronic products are required, various techniques have been disclosed in the art.

By using a stack of at least two chips, i.e., the so-called 3D package, in the case of a memory device for example, it is possible to produce a product having a memory capacity which is twice as large as that obtainable through semiconductor integration processes. Also, a stack package provides advantages not only of an increase in memory capacity but also in regards to mounting density and mounting area utilization efficiency. Due to such advantages, research and development of stack package technology has accelerated.

As an example of a stack package, a through-silicon via (TSV) has been disclosed in the art. The stack package using a TSV has a structure in which the TSV is disposed in a chip so that chips are physically and electrically connected with each other through the TSV. Generally, a TSV is formed by etching a vertical via through a substrate and filling the via with a conductive material, such as copper. To increase the transmission speed and for high-density fabrication, the thickness of a semiconductor wafer comprising multiple integrated circuit structures each having the TSV should be reduced.

U.S. Pat. No. 7,683,459 discloses a hybrid bonding method for through silicon via based wafer stacking, in which patterned adhesive layers are provided to join together adjacent wafers in the stack, while solder bonding is used to electrically connect the lower end of the via in the upper wafer to the bump pad on the upper end of the via in the lower wafer. However, the formation of the bump pad on the upper end of the via requires seeding, electroplating, photolithography and etching processes; therefore, the formation of the bump pad on the upper end of the via is very complicated and expensive.

SUMMARY OF THE INVENTION

An aspect of the present invention is to provide an integrated circuit device and method for preparing the same by bonding wafers prior to the formation of the through silicon via such that no bump pad is positioned between the stacking wafer and the bottom wafer; therefore, the issues of complicated processing and high cost can be resolved.

One aspect of the present invention discloses an integrated circuit device comprising a bottom wafer, at least one stacking wafer positioned on the bottom wafer, and at least one conductive via penetrating through the stacking wafer and into the bottom wafer in a substantially linear manner, wherein the bottom wafer and the stacking wafer are bonded by an intervening adhesive layer, and no bump pad is positioned between the bottom wafer and the stacking wafer.

Another aspect of the present invention discloses a method for preparing an integrated circuit device comprising the steps of forming a bottom wafer, forming at least one stacking wafer, bonding the at least one stacking wafer to the bottom wafer by an intervening adhesive layer, and forming at least one conductive via penetrating through the stacking wafer and into the bottom wafer in a substantially linear manner, wherein no bump pad is positioned between the bottom wafer and the stacking wafer.

Compared to the technique disclosed in U.S. Pat. No. 7,683,459 forming one bump pad for each wafer, the embodiment of the present invention forms the integrated circuit device by bonding wafers prior to the formation of the through silicon via that penetrates through the stacking wafer and not through the bottom wafer. Consequently, the embodiment of the present invention does not need to form the bump pad between the stacking wafer and the bottom wafer; therefore, the issues of complicated processing and high cost can be resolved.

The foregoing has outlined rather broadly the features and technical advantages of the present invention in order that the detailed description of the invention that follows may be better understood. Additional features and advantages of the invention will be described hereinafter, and form the subject of the claims of the invention. It should be appreciated by those skilled in the art that the conception and specific embodiment disclosed may be readily utilized as a basis for modifying or designing other structures or processes for carrying out the same purposes as those of the present invention. It should also be realized by those skilled in the art that such equivalent constructions do not depart from the spirit and scope of the invention as set forth in the appended claims.

BRIEF DESCRIPTION OF THE DRAWINGS

The accompanying drawings, which are incorporated in and constitute a part of this specification, illustrate embodiments of the disclosure and, together with the description, serve to explain the principles of the invention.

DETAILED DESCRIPTION OF THE INVENTION

Figure 1:
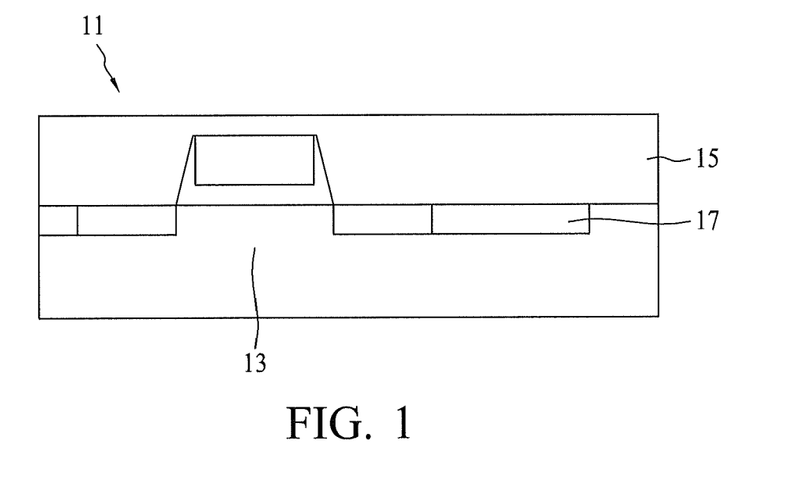
FIGS. 1 through 12 are cross-sectional views illustrating a method for forming an integrated circuit device in accordance with one embodiment of the present invention.
Figure 2:
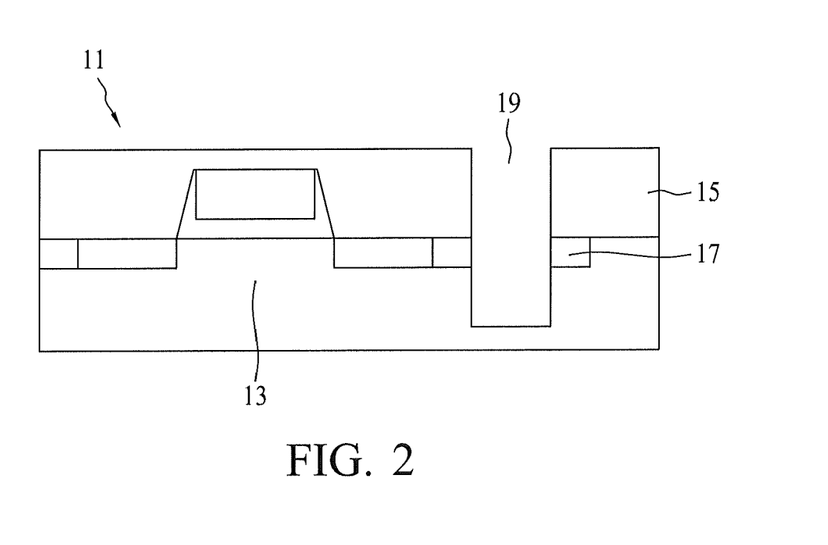

FIG. 1 to FIG. 12 are cross-sectional views illustrating a method for forming an integrated circuit device 100 in accordance with one embodiment of the present invention. Referring to FIG. 1, fabrication processes are performed to form an active element 13 such as a transistor in a silicon wafer 11, with a dielectric layer 15 covering the active element 13 and a shallow trench isolation 17 next to the active element 13 in the wafer 11. Subsequently, an etching process is performed to form a depression 19 in the shallow trench isolation 17, as shown in FIG. 2. In one embodiment of the present invention, the depression 19 penetrates through the shallow trench isolation 17.

Figure 3:
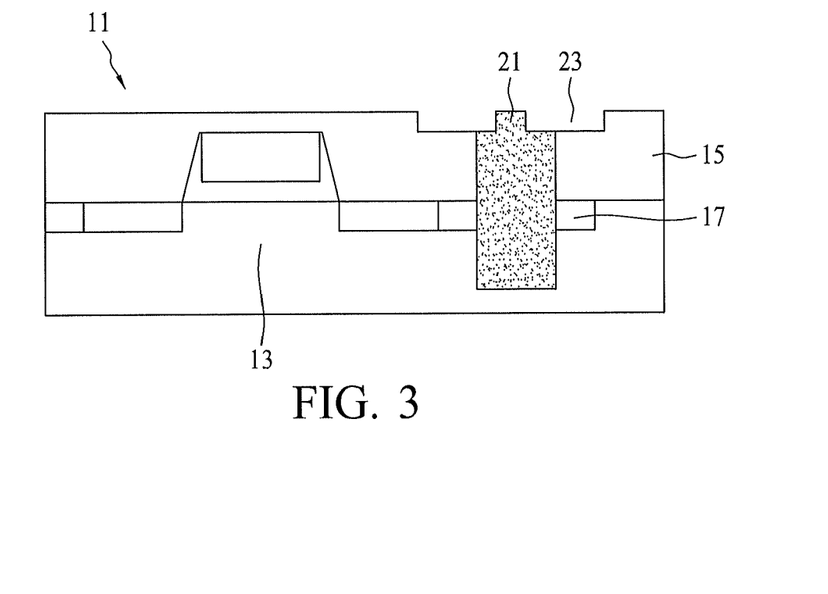
Figure 4:
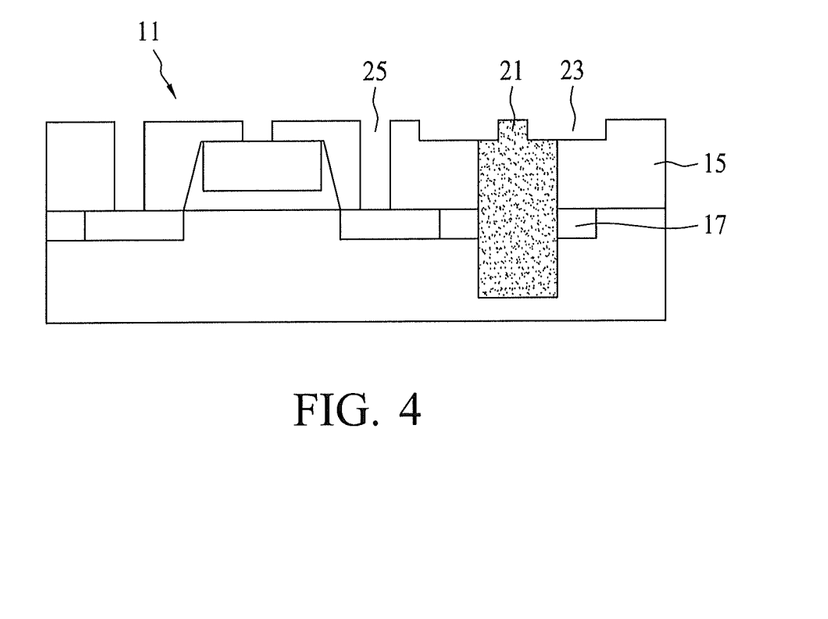

Referring to FIG. 3, the depression 19 is filled with dielectric material by deposition process to form a dielectric block 21, and photolithographic and etching processes are then performed to remove a portion of the dielectric block 21 and the dielectric layer 15 to form at least one concavity 23. Referring to FIG. 4, photolithographic and etching processes are performed to remove a portion of the dielectric layer 15 to form at least one contact hole 25, which exposes at least one terminal of the active element 13, as shown in FIG. 4.

Figure 5:
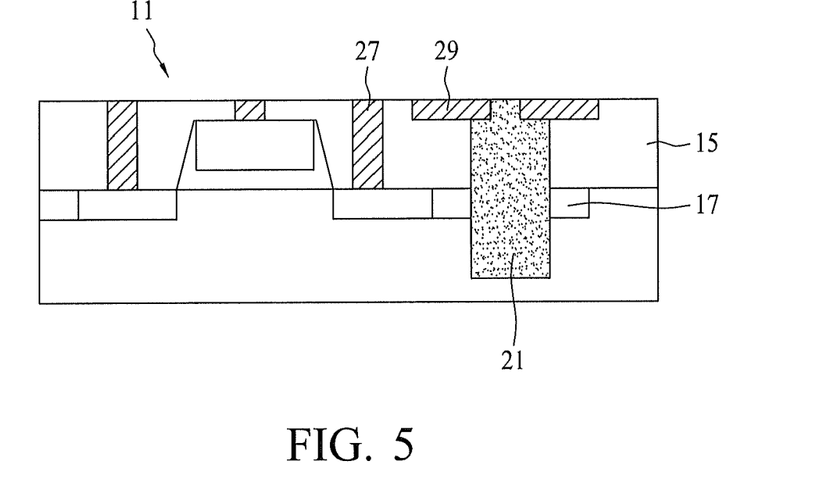
Figure 6:
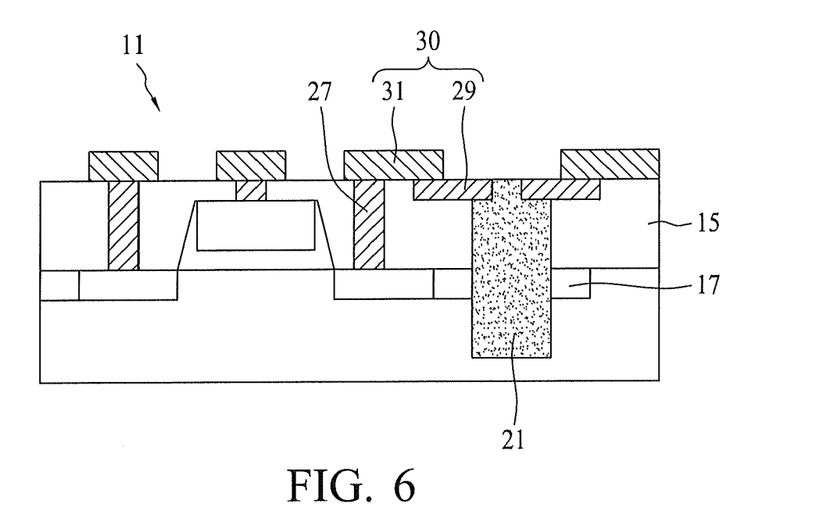

Referring to FIG. 5, a deposition process is performed to form a contact plug 27 by filling the contact hole 25 and an interconnect 29 by filling the concavity 23 with the same conductive material such as tungsten. Subsequently, a conductive layer 31 is formed by deposition process to electrically connect the interconnect 29 to the active element 13 through the contact plug 27, as shown in FIG. 6. In one embodiment of the present invention, the interconnect 29 and the conductive layer 31 form a connecting structure 30.

Figure 7:
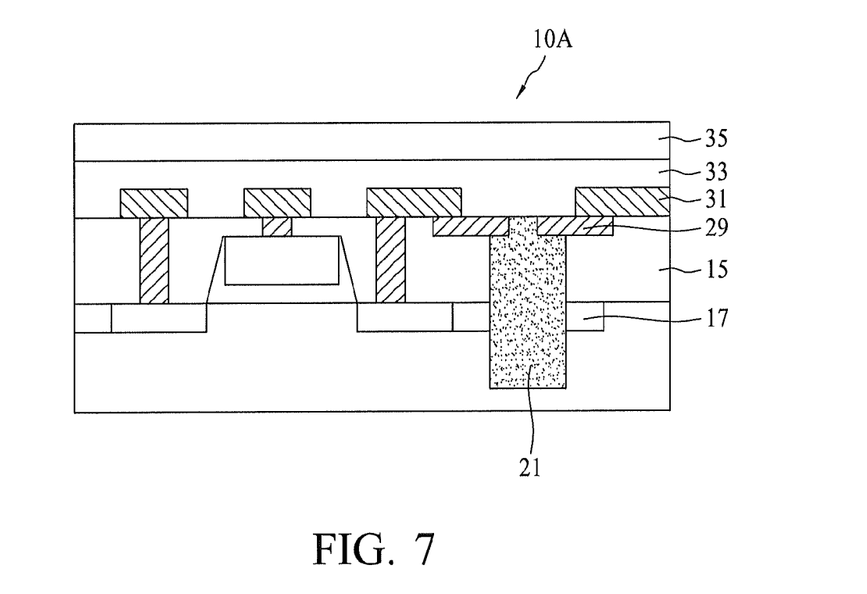
Figure 8:
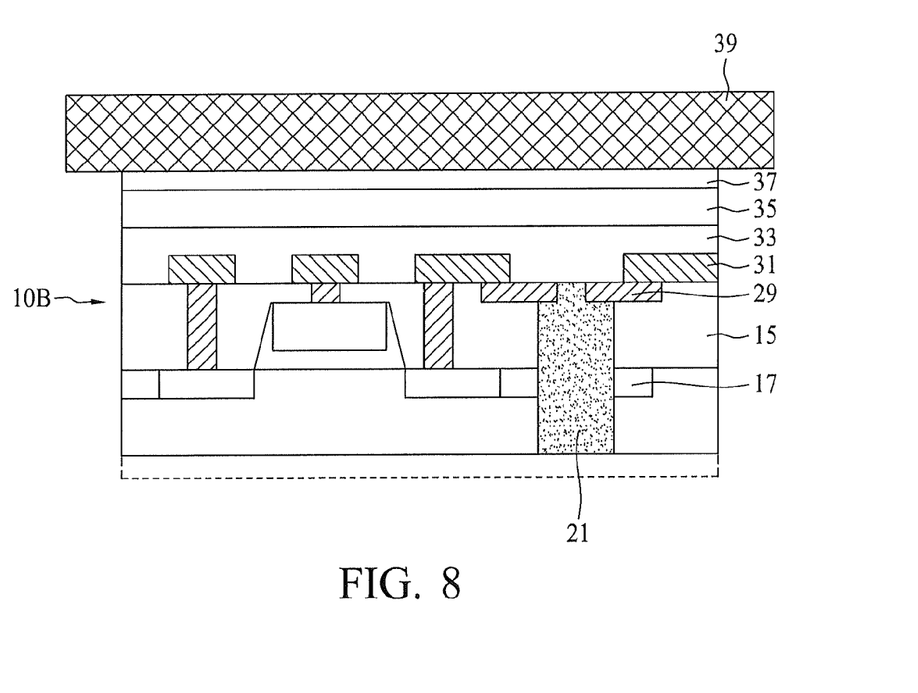

Referring to FIG. 7, a dielectric layer 33 is formed by deposition process to cover the conductive layer 31 and a passivation layer 35 is then formed by deposition process to cover the dielectric layer 33 to form a bottom wafer 10A. The fabrication processes shown in FIG. 1 to FIG. 6 are performed again on another wafer 11, a carrier 39 is adhered to the top side of the wafer 11 via an adhesive 37, and a thinning process such as the backside grinding process or CMP process is then performed to remove a portion of the wafer 11 from the bottom side of the wafer 11 to form a stacking wafer 10B, as shown in FIG. 8.

Figure 9:
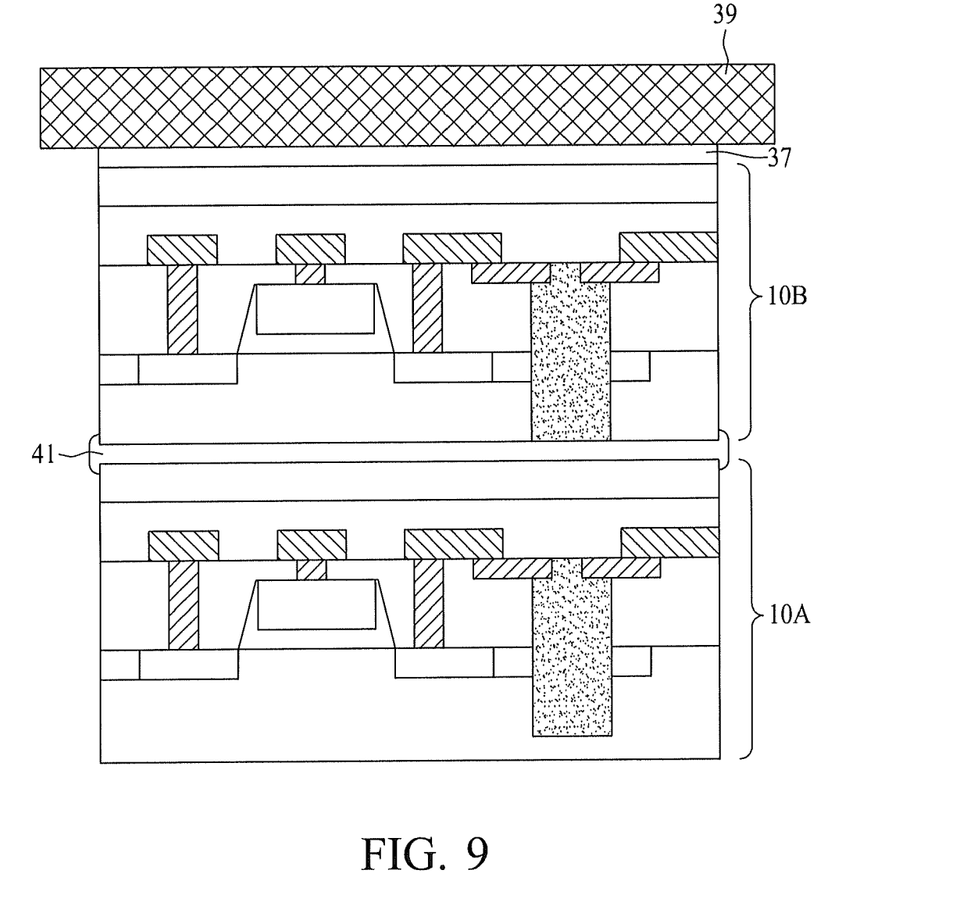
Figure 10:
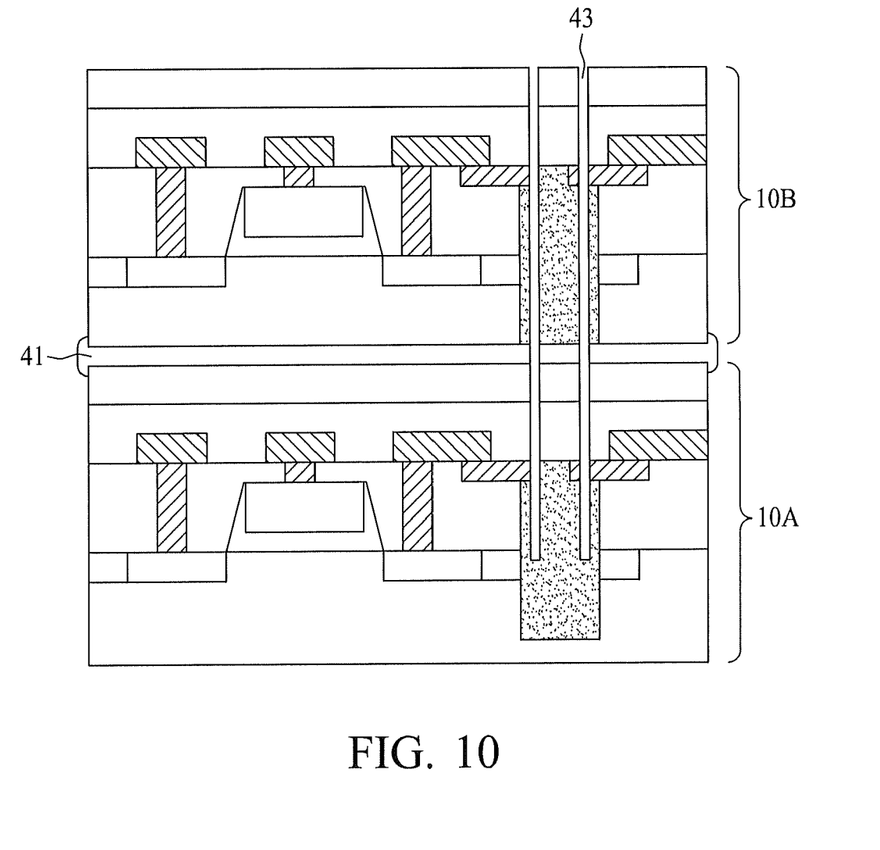

Referring to FIG. 9, the stacking wafer 10B is bonded to the bottom wafer 10A by an intervening adhesive layer 41 without forming a bump pad between the bottom wafer 10A and the stacking wafer 10B. In one embodiment of the present invention, the intervening adhesive layer 41 is the only layer between the bottom wafer 10A and the stacking wafer 10B, i.e., the stacking wafer 10B is bonded to the bottom wafer 11A without using solder. Subsequently, the carrier 39 and the adhesive 37 are removed from the top side of the stacking wafer 10B, and a dry etching process using fluorine-containing etching gas is then performed to form at least one via hole 43 penetrating through the stacking wafer 10B and into the bottom wafer 10A in a substantially linear manner, as shown in FIG. 10. In one embodiment of the present invention, the at least one via hole 43 does not penetrate through the bottom wafer 10A.

Figure 11:
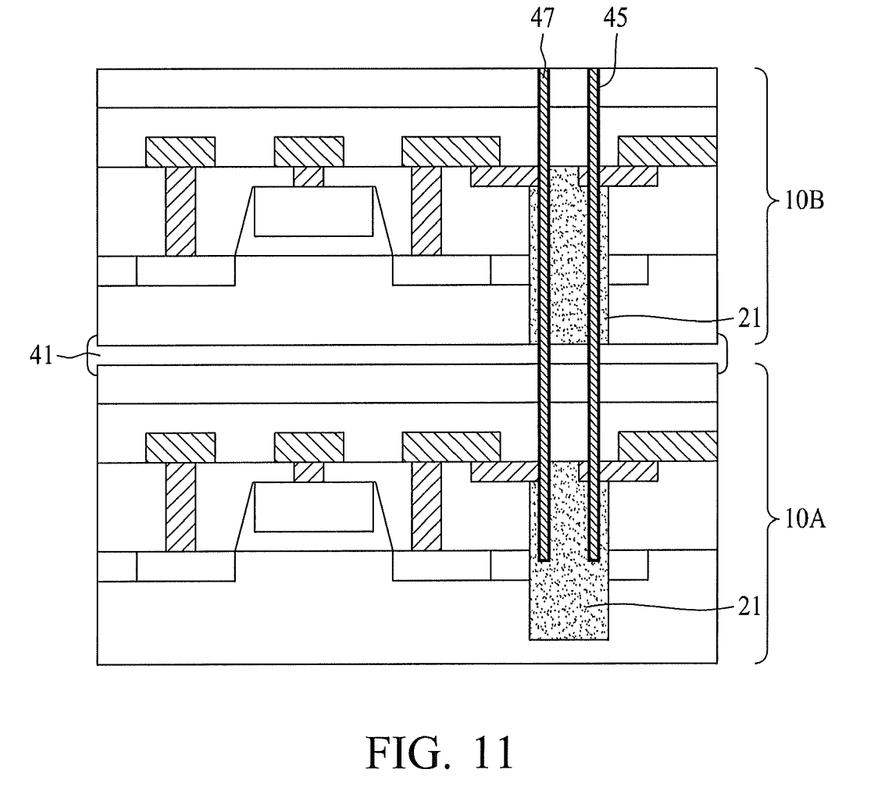

Referring to FIG. 11, a barrier layer and seed layer 45 is formed in the via hole 43 by physical vapor deposition, and an electroplating process is then performed to form a conductive via (TSV) 47 by filling the via hole 43 with conductive material such as copper. In one embodiment of the present invention, the conductive via 47 penetrates through the dielectric block 21 of the stacking wafer 10B, and does not penetrate through the bottom wafer 10A. In particular, the conductive via 47 does not penetrate through the dielectric block 21 of the bottom wafer 10A.

Figure 12:
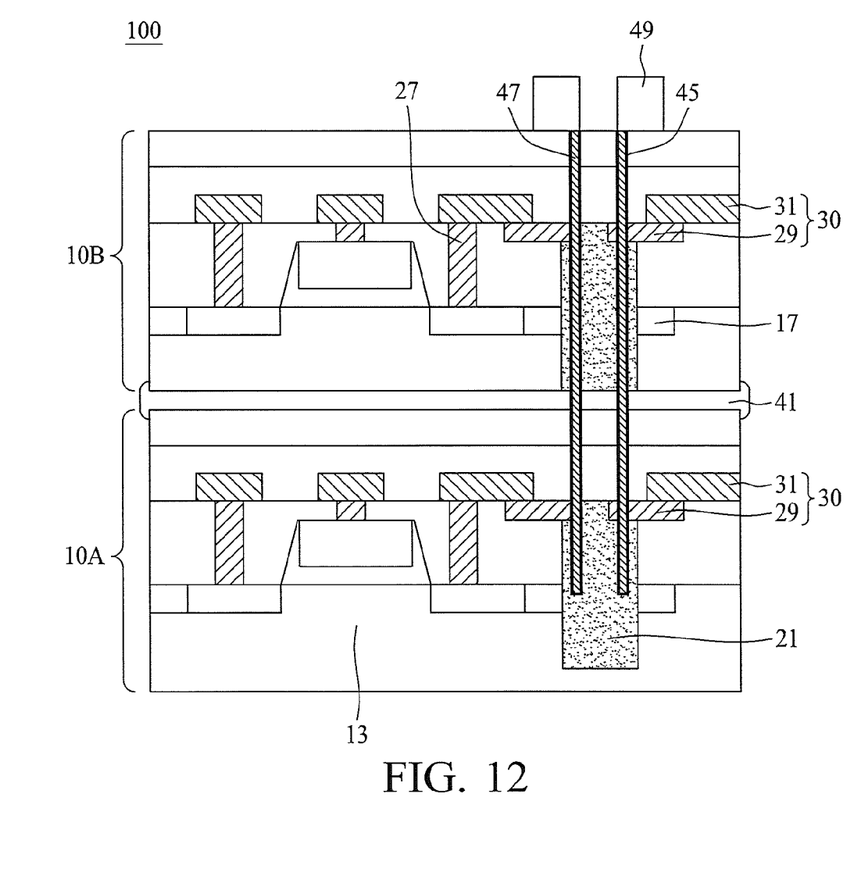

Referring to FIG. 12, a bump pad 49 is formed on the stacking wafer 10B to complete the integrated circuit device 100. In one embodiment of the present invention, the conductive via 47 is positioned in the shallow trench isolation 17 and connected to the bump pad 49. In one embodiment of the present invention, the conductive via 47 is electrically connected to the interconnect 29 of the connecting structure 30, and the conductive layer 31 of the connecting structure 30 electrically connects the active element 13 to the interconnect 29; therefore, the active element 13 is electrically connected to the conductive via 47.

Compared to the technique disclosed in U.S. Pat. No. 7,683,459 forming one bump pad for each wafer, the embodiment of the present invention forms the integrated circuit device 100 by bonding wafers 10A and 10B before the formation of the through silicon via 47 that penetrates through the stacking wafer 10B and not through the bottom wafer 10A. Consequently, the embodiment of the present invention does not need to form the bump pad 49 between the stacking wafer 10B and the bottom wafer 10A; therefore, the issues of complicated processing and high cost can be solved.

Although the present invention and its advantages have been described in detail, it should be understood that various changes, substitutions and alterations can be made herein without departing from the spirit and scope of the invention as defined by the appended claims. For example, many of the processes discussed above can be implemented in different methodologies and replaced by other processes, or a combination thereof.

Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. An integrated circuit device, comprising:
a bottom wafer including:
a first active element;
a first trench isolation disposed next to the first active element;
a first dielectric block penetrating through the first trench isolation;
a first dielectric layer covering the first active element, the first trench isolation and the first dielectric block;
a first connecting structure disposed on the first dielectric block and the first trench isolation; and
at least one stacking wafer positioned on the bottom wafer and including:
a second active element;
a second trench isolation disposed next to the second active element;
a second dielectric block penetrating through the second trench isolation and bottom side of the second dielectric block is exposed by wafer thinning removing backside conduction active element;
a second dielectric layer covering the second active element, the second trench isolation and the second dielectric block;
a second connecting structure disposed on the second dielectric block and the second trench isolation; and
wherein the bottom wafer and the at least one stacking wafer are bonded by an intervening adhesive layer, no bump pad is positioned between the bottom wafer and the at least one stacking wafer, and
at least one conductive via penetrating through the at least one stacking wafer and into the bottom wafer in a substantially linear manner, wherein the at least one conductive via is surrounded by the first dielectric block and the second dielectric block.

2. The integrated circuit device of claim 1, wherein the at least one conductive via penetrates through the second dielectric block.

3. The integrated circuit device of claim 1, wherein the at least one conductive via does not penetrate through the bottom wafer.

4. The integrated circuit device of claim 1, wherein a position of the first dielectric block vertically overlaps a position of the second dielectric block, the at least one conductive via penetrates through the second dielectric block, and the at least one conductive via does not penetrate through the first dielectric block.

5. The integrated circuit device of claim 1, wherein the at least one stacking wafer comprises a top wafer having a bump pad, and the at least one conductive via is connected to the bump pad.

6. The integrated circuit device of claim 1, wherein the first connecting structure electrically connects the at least one conductive via to first active element, the second connecting structure electrically connects the at least one conductive via to the second active element.

7. The integrated circuit device of claim 6, wherein the first connecting structure comprises:
    an interconnect electrically connected to the at least one conductive via; and
    a conductive layer electrically connecting the first active element to the interconnect.

8. The integrated circuit device of claim 7, wherein the at least one stacking wafer comprises a contact plug, and the interconnect and the contact plug are made of the same conductive material.

9. The integrated circuit device of claim 1, wherein no solder is positioned between the bottom wafer and the at least one stacking wafer.

10. A method for preparing an integrated circuit device, comprising the steps of:
    forming a bottom wafer;
    forming at least one stacking wafer;
    bonding the at least one stacking wafer to the bottom wafer by an intervening adhesive layer, without forming a bump pad between the bottom wafer and the at least one stacking wafer, wherein the at least one stacking wafer comprises at least one second active element, a second dielectric block and a second trench isolation next to the active element, the second dielectric block penetrates through the second trench isolation, the bottom wafer comprise a first active element, a first dielectric block and a first trench isolation, the first dielectric block penetrates through the first trench isolation; and
    forming at least one conductive via penetrating through the at least one stacking wafer and into the bottom wafer in a substantially linear manner, wherein the at least one conductive via is surrounded by the first dielectric block and the second dielectric block.

11. The method for preparing an integrated circuit device of claim 10, wherein the forming of the at least one stacking wafer comprises a step of forming the second dielectric block, and the at least one conductive via penetrates through the second dielectric block.

12. The method for preparing an integrated circuit device of claim 10, wherein the at least one conductive via is formed without penetrating through the bottom wafer.

13. The method for preparing an integrated circuit device of claim 10, wherein the forming of the bottom wafer comprises a step of forming the first dielectric block and the second dielectric block, a position of the first dielectric block vertically overlaps a position of the second dielectric block, the at least one conductive via penetrates through the second dielectric block, and the at least one conductive via does not penetrate through the first dielectric block.

14. The method for preparing an integrated circuit device of claim 10, further comprising a step of forming a bump pad on the at least one stacking wafer, wherein the at least one conductive via is connected to the bump pad.

15. The method for preparing an integrated circuit device of claim 10, wherein the forming of the at least one stacking wafer comprises steps of forming a first connecting structure electrically connected to the first active element.

16. The method for preparing an integrated circuit device of claim 15, wherein the forming of the first connecting structure comprises the steps of:
    forming an interconnect in a predetermined area of the at least one stacking wafer, wherein the at least one conductive via is positioned in the predetermined area;
    forming a conductive contact between the predetermined interconnect and the at least one conductive via; and
    forming a conductive layer electrically connecting the first active element to the interconnect.

17. The method for preparing an integrated circuit device of claim 16, wherein the forming of the at least one stacking wafer comprises a step of forming a contact plug connected to the first active element, and the interconnect and the contact plug are made of the same conductive material.

18. The method for preparing an integrated circuit device of claim 10, wherein the bonding of the at least one stacking wafer to the bottom wafer is performed without using solder between the bottom wafer and the at least one stacking wafer.

* * * * *